United States Patent [19]

Kellogg

[11] 3,939,398
[45] Feb. 17, 1976

[54] INDICATOR LAMP CIRCUIT HAVING FEEDBACK PROTECTION

[75] Inventor: Walter J. Kellogg, Beaver, Pa.

[73] Assignee: Westinghouse Electric Corporation, Pittsburgh, Pa.

[22] Filed: Dec. 16, 1974

[21] Appl. No.: 533,407

[52] U.S. Cl. ............................. 324/21; 340/214
[51] Int. Cl.² ........................................ G01R 31/22
[58] Field of Search ............... 324/20, 21, 22, 23; 340/214, 250, 251

[56] References Cited
UNITED STATES PATENTS

| | | | |
|---|---|---|---|
| 2,839,741 | 6/1958 | Kratville | 340/214 X |
| 3,040,243 | 6/1962 | Weiss | 324/20 |
| 3,840,801 | 10/1974 | Kellogg et al. | 324/21 |

FOREIGN PATENTS OR APPLICATIONS

| | | | |
|---|---|---|---|
| 155,179 | 12/1963 | U.S.S.R. | 340/214 |

Primary Examiner—Alfred E. Smith
Assistant Examiner—Rolf Hille
Attorney, Agent, or Firm—W. A. Elchik

[57] ABSTRACT

A circuit, having protection against current feedback when a component fails, for testing indicator lights whereby multiple lights may be tested simultaneously by pressing one pushbutton and closing one set of normally open contacts. The test pushbutton and the indicator signal operate at a higher voltage such as 120 volts AC and the indicator lamp is operated at a low voltage such as 6 volts, providing safety and allowing the use of inexpensive incandescent indicator bulbs. Only one indicator transformer is required for each indicator light. In one embodiment of the invention a pair of diodes are provided on the high voltage connection to indicator transformer to permit a test signal or a normal operating signal to activate the indicator bulb without affecting the rest of the circuit. A single common return line is used to provide a return line for the test circuit and the operating signal circuit. A transformer diode is connected across the primary of the indicator transformer, and fuses are disposed in series with each of the pair of diode provided on the high voltage side connection to the indicator transformer. When a signal diode or a test diode failure occurs a surge of current flows through the transformer diode and blows the appropriate fuse. The fuse blowing isolates the test circuit from the signal circuit. In another embodiment of the invention a single fuse is provided in the signal line connection to the high voltage side of the indicator transformer. A Zener diode is also provided in series with the transformer diode in a back-to-back relationship. This allows kick back to flow in the primary winding of the transformer which is less than the Zener breakdown level. It is important to allow this inductive kick back to flow for two reasons. One is that transformed to the secondary, it contributes to overall greater brilliance in the lamp and; second is that it tends to demagnetize the iron in the transformer core. However, when either the test or signal diode fails, the potential rises to a value greater than the Zener breakdown level, across the Zener diode and transformer diode which conduct, blowing the associated fuse. This then isolates the test circuit from the signal circuit. The disclosed invention prevents a failure of the test or signal diode from adversely affecting other circuits connected to the signal lamp test circuit.

14 Claims, 2 Drawing Figures

INDICATOR LAMP CIRCUIT HAVING FEEDBACK PROTECTION

BACKGROUND OF THE INVENTION

1. Field of the Invention

This invention relates to a test circuit for indicator lamps and more particularly to an improved circuit for simultaneously testing indicator lamps including builtin protection against current feedback upon component failure.

2. Description of the Prior Art

On modern machinery there are many applications where multiple indicator lights are used. It is advantageous to be able to rapidly test many indicator lamps by depressing a single pushbutton. A problem with some of the prior art test circuits is that many relays or multipole pushbuttons are required in the test circuit. In some of the prior art indicator circuits, the normal signal circuits, the test circuit, and the indicator lamp circuits are all operated at the same potential. It is desirable to have a circuit in which the test pushbutton and the indicator signal are at a higher normal operating voltage such as 120 volts AC while the indicator lamp is maintained at a low voltage such as 6 volts for system safety and cost.

In prior art U.S. Pat. No. 3,040,243 issued June 19, 1962 to I. F. Weiss, a test circuit for an indicator system utilizing a single test pushbutton is disclosed. A problem with this circuit as disclosed in Weiss is that a separate transformer is required for the test circuit. The separate test transformer can cause polarity and installation difficulties. In this prior art circuit the diodes are disposed on the low voltage side of the transformers. In a low voltage indicator circuit the voltage drop across the diodes can be significant.

It is also desirable to have a high reliable fail safe test circuit. The test circuit disclosed in U.S. Patent application Ser. No. 398,353 now U.S. Pat. No. 3,840,801 overcomes many of the problems associated with prior art test circuits. Normally, an indicating light is wired in parallel with a relay coil to indicate an energized condition. For bulb test, rectified AC is fed into the primary of the transformer which is normally blocked by a rectifier on the line between the transformer and relay coil. If one or both rectifiers should short and let current pass in the reverse direction, it would be possible that the relay coil would become energized. The circuit as disclosed in copending U.S. application Ser. No. 398,353 now U.S. Pat. No. 3,840,801 can possibly have an isolation problem between the tests circuit and the signal circuit upon component failure. It is desirable to have a signal and test circuit combination which is highly reliable and not susceptible to showing erroneous indications. It is desirable that a malfunction of one component of the indicator lamp circuit will not cause erroneous signal lamp lighting or remote device activation. It is also desirable that isolation between the test circuit and the signal circuits be maintained upon failure of some of the isolating components.

SUMMARY OF THE INVENTION

An improved indicator lamp circuit is provided which gives positive protection against feedback of power during testing. The indicator lamp circuit provided has a disconnecting device which operates upon failure of the isolating components between the test and signal circuits.

In the disclosed indicator lamp circuit each indicator lamp is directly connected to the low voltage side of an indicator transformer. A test circuit and a normal signal indicator circuit are connected to one leg of the primary high voltage side of the indicator transformer. The other leg of the indicator transformer is connected to a common line utilized by the test and indicator signal circuit. A transformer diode is connected across the primary high voltage side of the indicator transformer. Isolating elements are provided for isolating the test and indicator signal circuits. A disconnecting element is disclosed in series with the isolating elements and is activated by current flow through the transformer diode. Thus, if an isolating element fails, the disconnecting element operates to disconnect the test circuit and the indicator signal circuit.

In one embodiment of the invention a test circuit diode is disposed in the test circuit connection to the indicator transformer and a signal circuit diode is disposed in the signal circuit connection to the indicator transformer. Each indicated transformer has one leg of the primary side connected to a common line used by the test circuit. A first fuse is connected in series with the signal circuit diode and a second fuse can be connected in series with the test circuit diode. Upon failure of either the test circuit diode or the signal circuit diode a short circuit current flows through the transformer diode causing the appropriate fuse to open. The transformer diode passes current to rapidly blow the fuse, which would not occur with the fuse alone. The transformer diode is connected to pass current of a polarity which is normally blocked by the test circuit diode and the signal circuit diode. Thus, as long as the test circuit diode and the signal circuit diode are operating normally, no excess current will be permitted to pass through the fuses and the fuses will not open. However, when either of the test circuit diode or the signal circuit diode fail, short circuit current will pass through the fuses opening the appropriate fuse and isolating the test circuit from the signal circuit.

In another embodiment of the invention a test circuit diode is disposed in the test circuit connection to the indicator transformer and a signal circit diode is disposed in the signal circuit connection to the same leg of the indicator transformer. A fuse is disposed in series with the signal circuit diode. A transformer diode is connected across the inputs of the indicator transformer. A Zener diode is connected in back-to-back relationship with the transformer diode to prevent current flow through transformer diode until a predetermined voltage, determined by the Zener breakdown level, is exceeded. Thus, during normal operation with 120V AC is a 100 volt breakdown Zener diode is utilized the normal voltage is only equal to 70 volts peaks which is induced by the transformer's field collapsing during the non-conducting half cycle and this is blocked by the Zener diode. When either the test circuit diode or the signal circuit diode fails the voltage imposed across the Zener diode rises to around 140 volts peak at this level the Zener diode conducts causing the fuse to open.

It is an object of this invention to provide an inexpensive highly reliable circuit for indicator lamp test having a disconnecting element which is activated in the event of isolating component failure.

BRIEF DESCRIPTION OF THE DRAWINGS

For a better understanding of the invention, reference may be had to the preferred embodiment exemplary of the invention shown in the accompanying drawings, in which.

DESCRIPTION OF THE PREFERRED EMBODIMENT

Figure 1:
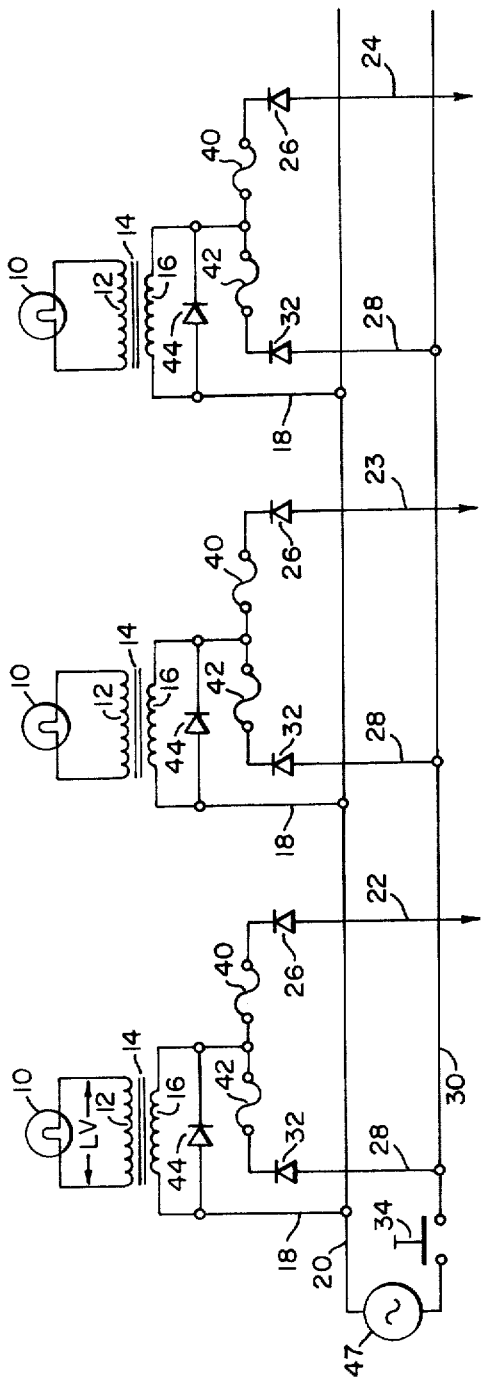
FIG. 1 illustrates a test circuit utilizing the teaching of the present invention; and, FIG. 2 illustrates a test circuit utilizing another embodiment of the invention.

Referring now to FIG. 1 there is shown an indicator light circuit utilizing the teaching of the present invention. A plurality of indicator lights are connected to the low voltage side 12 of an indicator transformer 14. Each indicator lamp 10 is supplied power from a single indicator transformer 14. Operation of the indicating lamp 10 is at a low voltage, such as for example 6 volts, allowing for the use of inexpensive bulbs and providing for safe operation. The high voltage side 16 of transformer 14 can be supplied from a higher voltage level, such as 120 volts AC. One leg 18 of the primary connection of each indicator transformer 14 is connected to a common line 20. Indicator signals are supplied from various devices to the primary of transformer 14 through signal wires 22, 23, and 24. A diode 26 is disposed in each of signal wires circuit 22, 23 and 24. An alternating current indicator signal is sent along indicator wire 22, 23, or 24 when various signal devices (not shown) are activated. Diode 26 rectifies the current which flows through indicating transformer 14 to illuminate signal light 10. The test signal line 28 is connected between the primary of transformer 14 and a common test line 30. A diode 32 is disposed in each test signal line 28. A single pole normally open pushbutton 34 is disposed in common test signal line 30. When pushbutton 34 is depressed an alternating current test signal is sent along line 30 into lines 28 through diode 32 and indicator transformers 14 to light indicators 10. Diode 26 in the operating signal circuit prevents the test signal from flowing into operator signal lines 22, 23, or 24. Diode 32 in the test signal line 28 prevents operating signals from flowing into the common test signal line 30. Thus each indicator light 10 can be activated by either a test signal or an operating signal. Each indicator 10 can be energized by an operating signal without energizing any other indicator light 10. Common line 20 connected to primary leg 18 of transformer 14 acts as a common return for test signals and for indicator signals. Since diodes 32 and 26 are disposed on the high voltage primary side of transformer 14, any small voltage drop across then is not significant. A signal line fuse 40 is disposed in series with the signal circuit diode 26. A test circuit fuse 42 is disposed in series with the test circuit diode 32. Fuses 40 or 42 will open, disconnecting the test circuit line 28 from the appropriate signal circuit line 22, 23, or 24 if current flow therethrough is excessive. A transformer diode 44 is connected across the primary of transformer 14. Transformer diode 44 is disposed facing test circuit diode 32 and signal circuit diode 26 so that a blocking path to normal operating current is formed. Upon a failure of an isolating component 26, 32 transformer diode 44 permits current to flow and rapidly blow the appropriate fuse 40, 42 isolating the test circuit and the indicator circuit. Without transformer diode 44 isolation would be too slow. That is, when diode 26, 32 and 44 are operating normally, diode pair 44 and 26 forms a blocking current path and diode pair 44 and 32 forms a blocking current path. If, however, diode 32 or 26 should fail a short circuit path is formed through diode 26 or 32 and the appropriate fuse. This will melt fuse 40 or 42 opening the circuit and isolating the test indicating circuit from the signal indicating circuit.

Figure 2:
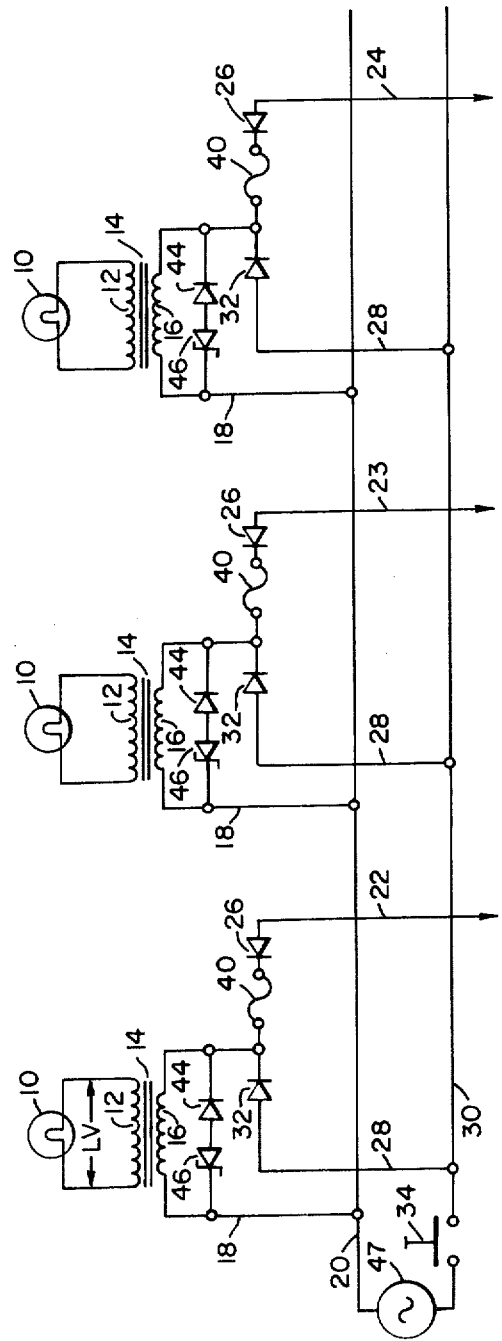

Referring now to FIG. 2 there is shown another embodiment of an indicator light circuit utilizing the teaching of the present invention. A plurality of indicator lights 10 are connected to the low voltage side 12 of an indicator transformer 14. Each indicator lamp 10 is supplied power from indicator transformer 14. Diode 32 is disposed in a test signal line 28 and diode 26 is disposed in the associated signal indicator line. Each indicator light 10 can be activated by either test signal or an operating signal. A transformer diode 44 is disposed across the primary of transformer 14. A Zener diode 46 is disposed in back-to-back relationship with the transformer diode 44. During normal operation a one-half rectified wave is supplied to the primary of transformer 14 through either diode 32 or 26. Zener diode 46 prevents transformer demagnetizing current from flowing through diode 44 during each non-conducting half cycle. During each half cycle Zener diode 46 is subject to around 70 volts peak, if a 120 volt AC power supply 47 is used. Zener diode 46 is selected to conduct at a voltage greater than 100 volts so during normal operation no current will flow through diode 44. However, if either diode 32 or 26 should fail, Zener diode 46 is subject to a voltage around 140 volts and if the breakdown level of Zener diode 46 is selected around 100 volts, then excessive current will flow through diode 44. This will cause fuse 40 to melt, isolating the test circuit from the indicator signal circuit.

The disclosed indicator lamp circuit is an improvement on prior art test circuits and protects against feedback when an isolating rectifier fails. When a diode 32 or 26 failure occurs a surge of current passes through and blows the appropriate fuse 40 or 42 which opens the circuit between the test and signal connection. This invention provides for an improvement indicator lamp circuit to give positive protection against feedback power during testing. Normally, the indicating lamp 10 is wired in parallel with a relay (not shown) to indicate energized condition. For bulb tests a rectified AC wave is fed into the primary of the transformer 14 which is normally blocked by a rectifier 26 on a line between the transformer 14 and the relay coil. If one or both of the rectifiers 26 or 32 should short and let current pass in a reverse direction, it would be possible that the relay coil could become energized. To protect against this, fuses 40 or 42 have been added along with the transformer rectifier 44. This will cause the appropriate fuse 40 or 42 to blow in a relatively short time to prevent energizing a relay coil. It is not possible to adequately protect the circuit from feedback current by using only a fuse, since in some circuits even a small amount of feedback for a short time can cause a problem. Another problem exists in that it takes AC to operate a transformer. Normally, with just diodes 26 and 32 a demagnetizing kick from the primary winding of transformer 14 which would amount to about 70 volts, is present; however, this is shorted by diode 44 so Zener diode 46 can be added to block current flow through diode 44 unless the voltage imposed is 100 volts or more. Thus, normally no current flows through diode 44. When failure occurs in diode 32 or 26 available current is supplied at a potential of over 140 volts peak across the Zener diode 46. Thus upon isolating diode 26 or 32 failure Zener diode 46 breaks down and diode 44 conducts blowing the fuse.

What we claim is:

1. An indicator light circuit comprising:
   a plurality of indicator lights;
   a transformer associated with each of said indicator lights having a primary side and a secondary side with only said associated indicator light being connected across the secondary of said transformer;
   test circuit means connected to the primary of each of said transformers for supplying a test current to the primary of all of said transformers when a check of said plurality of indicator lights is required;
   signal circuit means associated with each of said plurality of transformers for supplying current to the primary of said associated transformer in response to operation of an external component;
   isolating means disposed in the primary connection to each of said transformers for preventing current flow from said signal circuit means through said test circuit means to the primary of any other transformer;
   a transformer diode connected across the primary of said transformer; and,
   fuse means disposed in series with said isolating means to disconnect said signal circuit means from said test circuit means upon failure of said isolating means.

2. An indicator light circuit as claimed in claim 1 wherein:
   a first diode is disposed in the test circuit means connected to each of said transformers; and,
   said signal circuit means and said test circuit means share a common return line; and,
   a first fuse is disposed in series with said first diode.

3. An indicator light circuit as claimed in claim 2 including:
   a second diode connected in the signal circuit connection to each of said plurality of transformers and being disposed to pass current of the same polarity as the current which can pass through said first diode;
   said transformer diode which is connected across the primary of said transformer is disposed to pass current of the opposite polarity as the current which can pass through said first diode; and,
   a second fuse disposed in series with said second diode.

4. An indicator light circuit comprising:
   a plurality of transformers having a primary side and a secondary side;
   a plurality of indicator lights each being connected across the secondary of one of said plurality of transformers;
   a plurality of signal circuits each being connected to the primary of one of said plurality of transformers;
   a test circuit for testing the operability of said plurality of indicator lights connected to the primary of all of said plurality of transformers; and
   isolating means disposed in the primary connection to each of said transformers for preventing current flow from one of said plurality of signal circuits to another of said plurality of signal circuits;
   a first plurality of unidirectional conducting devices each being connected across the primary of one of said plurality of transformers in back-to-back relationship with said isolating means; and,
   fuse means disposed in series with said isolating means.

5. An indicator light circuit as claimed in claim 4 wherein said isolating means comprises:
   a second plurality of unidirectional current conductors each being disposed in the connection of said test circuit to the primary of each of said plurality of transformers; and,
   said fuse means comprises a first plurality of fuses disposed in series with said second plurality of unidirectional current conductors.

6. An indicator light circuit as claimed in claim 5 wherein said isolating means comprises:
   a third plurality of unidirectional current conductors each being disposed in the connection of one of said plurality of signal circuits to one of said transformers;
   each of said secnd plurality of unidirectional current conductors oriented so as to pass current of a polarity which will be blocked by one of said first plurality of unidirectional current conductors disposed in the connection of said test circuit to the primary of said transformer;
   each of said second plurality of unidirectional current conductors oriented so as to pass current of polarity which will be blocked by one of said first plurality of unidirectional current conductors disposed across the primary of said transformer; and,
   said fuse means comprises a second plurality of fuses each being connected in series with one of said third plurality of unidirectional current conductors.

7. An indicator light circuit as claimed in claim 6 including:
   a common return line forming a part of said plurality of signal circuits and a part of said test circuits.

8. An indicator light and test circuit for use on an alternating current system comprising:
   a plurality of indicator lights;
   a plurality of indicator transformer for said plurality of indicator lights having a high voltage side and a low voltage side;
   each of said indicator lights being connected to the low voltage side of one of said indicator transformer;
   each of said indicator transformers having a first high voltage side leg and a second high voltage side leg;
   a normally open pushbutton having an input connection, connected to the alternating current system, and an output connection;
   a test line for each indicator transformer disposed between and connected to the first high voltage side leg of said indicator transformer and the output connection of said normally open pushbutton;
   a diode disposed in each of said test lines limiting current flow to one direction;
   a fuse disposed in each of said test lines for opening the associated test line when the current flow therethrough exceeds a predetermined value;
   an operating signal light connected to the first high voltage side leg of each of said indicator transformers;
   signal indicator means for energizing each of said signal lines with an alternating current in response to external signals; and, a transformer diode connected across the high voltage side of said indicator transformer.

9. An indicator light circuit as claimed in claim 8 comprising:
   a common conductor;
   conducting means connecting the second high voltage leg of each of said indicator transformers to said common conductor; and,
   said transformer diode disposed to pass current of an opposite polarity as the current passed by said diode.

10. An indicator light circuit as claimed in claim 9 comprising:
    a signal circuit diode disposed in each of said signal conductors;
    a second fuse disposed in series with said signal circuit diode; and,
    each of said signal circuit diodes being oriented so as to permit current flow through the high voltage side of said indicator transformer in the same direction as that permitted by the associated test circuit diode.

11. A test and indicator circuit for use on an alternating current system comprising:
    an indicator transformer having a high voltage side and a low voltage side;
    an indicator light connected across the low voltage side of said indicator transformer;
    a test circuit connected to the high voltage side of said indicator transformer for supplying power to said indicator transformer when a test of the indicator light is desired;
    a first unidirectional current conducting device disposed in said test circuit;
    an indicator circuit connected to the high voltage side of said indicator transformer for supplying power to said indicator transformer in response to operation of a remote device;
    a second unidirectional current conducting device disposed in said indicator circuit;
    a first fuse disposed in series with said second unidirectional current conducting device; and,
    a third unidirectional current conducting device connected across the high voltage side of said indicator transformer.

12. A test and indicator circuit as claimed in claim 11 comprising:
    a second fuse disposed in series with said first unidirectional current conducting device.

13. A test and indicator circuit as claimed in claim 11 comprising:
    a unidirectional breakdown device disposed in series with said third unidirectional current conducting device.

14. A test and indicator circuit as claimed in claim 13 wherein said unidirectional breakdown device comprises a Zener diode.

* * * * *